United States Patent [19]
Zuckerman

[11] Patent Number: 5,802,463
[45] Date of Patent: Sep. 1, 1998

[54] APPARATUS AND METHOD FOR RECEIVING A MODULATED RADIO FREQUENCY SIGNAL BY CONVERTING THE RADIO FREQUENCY SIGNAL TO A VERY LOW INTERMEDIATE FREQUENCY SIGNAL

[75] Inventor: Lawrence H. Zuckerman, Pleasanton, Calif.

[73] Assignee: Advanced Micro Devices, Inc., Sunnyvale, Calif.

[21] Appl. No.: 699,991

[22] Filed: Aug. 20, 1996

[51] Int. Cl.$^6$ .................................................. H04B 1/16
[52] U.S. Cl. .................................... 455/208; 455/318
[58] Field of Search ............................. 455/203, 205, 455/208, 318, 324, 313, 314, 315

[56] References Cited

U.S. PATENT DOCUMENTS

| | | | |
|---|---|---|---|
| 4,653,117 | 3/1987 | Heck | 455/209 |
| 4,852,123 | 7/1989 | Bickley et al. | 375/223 |
| 5,109,531 | 4/1992 | Heck | 455/203 |

*Primary Examiner*—Amelia Au
*Attorney, Agent, or Firm*—Foley & Lardner

[57] ABSTRACT

A very low intermediate frequency (IF) transceiver is described for use in a wireless LAN, cellular telephone, cordless telephone, and other radio transceiver applications. The transceiver preferably directly down-converts the RF signal to lower frequency such as a very low IF signal, which can be handled by transceiver components advantageously integrated with the communication control system such as an MAC or serial communications controller. Preferably, the very low IF signal is above peak modulation deviation and below the channel interval for the communication system. The very low IF signal may be up converted so that the RF signal can be more reliably demodulated. Alternatively, the RF signal can be additionally converted to a second IF frequency before the very low IF frequency to reduce the effects of noise in the transceiver. Alternatively, an image rejection mixer circuit can be employed to provide some rejection selectivity for the adjacent channels on one side of the local oscillator. Alternatively, a phasing circuit can be added in the receiver front end to assist in the isolation of the local oscillator signal from the antenna.

19 Claims, 6 Drawing Sheets

APPARATUS AND METHOD FOR RECEIVING A MODULATED RADIO FREQUENCY SIGNAL BY CONVERTING THE RADIO FREQUENCY SIGNAL TO A VERY LOW INTERMEDIATE FREQUENCY SIGNAL

TECHNICAL FIELD

The present invention relates generally to a receiver for electromagnetic waves. More particularly, the present invention relates to a receiver for use in a wireless local area network, or cordless telephone.

BACKGROUND OF THE INVENTION

Computer systems such as workstations, personal computers, notebook computers, personal digital assistants (PDAs) or other electronic processing units may be interconnected via a wireless local area network (LAN). Each computer system includes a communications control system (e.g., a media access controller (MAC), a serial or non-serial communications controller or other communications moderating device) and a wireless transceiver. The communications control system governs the exchange of data between the computer system and the wireless transceiver. For example, the communications control system selects the channel at which the transceiver operates, organizes data packets for transmission and reception across the LAN, performs error correction on received data packets, controls retransmissions of data packets in the event of transmission or reception errors, and temporarily stores incoming and outgoing data for the computer system and transceiver.

Typically, transceivers for wireless LANs are superheterodyne radio frequency (RF) receivers. Superheterodyne receivers down-convert the received signal (e.g., the RF signal) to one or more intermediate frequency (IF) signals. The IF signals have fixed, or at least restricted, frequencies which allow the IF signals to be more easily filtered, amplified, and otherwise processed. In conventional superheterodyne receivers, an antenna provides RF signals which are fed into a band pass RF filter which selectively passes only the RF signals (both desired and otherwise) and noise within a bandwidth of interest while attenuating other RF signals and noise outside this bandwidth, thereby reducing the necessary dynamic range of the succeeding stages. The band-limited RF signals and noise are then amplified by a low noise amplifier (LNA). To assist the RF filter in attenuating electrical noise and signals that are amplified by the LNA and fall within the image frequency band—which are especially critical because they can pass unfiltered through the intermediate frequency (IF) section—the amplified RF signal from the LNA is filtered by an image filter. A mixer mixes the amplified RF signal with a local oscillator (LO) frequency signal to convert the band-limited RF signals to an IF band, along with undesired mixing products.

The IF signals from the mixer are generally coupled to an IF filter, which passes mainly the sub-band containing the desired signals. This (and any succeeding) IF filter passes without further attenuation the remnants of any undesired signals and noise present in the image sub-band of the image band which were insufficiently filtered by the RF filter and image filter. In a second mixer, the filtered IF signal mixes with a different, typically lower LO frequency, thereby converting the signal into a lower IF frequency signal, which is amplified and filtered by another IF amplifier and IF filter. In the process of propagation through the IF filters and amplifiers, the desired IF signal present in the sub-band passed by the filters is selected in favor of signals and noise present at other sub-bands in the IF. It should be understood however, that unwanted signals present at the image channels of either the first and second conversions and not adequately filtered by the RF filters and first IF filters will appear directly in the 2nd IF sub-band of the desired signal and therefore cannot be filtered. The selected IF signal is typically demodulated and translated into a baseband information signal for use by the communications control system. Although many variations of the superheterodyne design exist, prior art superheterodyne designs generally share the characteristics, restrictions and advantages of the described superheterodyne receiver.

One disadvantage of the conventional superheterodyne design is that it cannot easily be fully integrated onto a Silicon integrated circuit (IC, or microchip). Most superheterodyne receivers require significant pre-conversion filters and high quality narrow band IF filters which operate at high frequencies. For instance, most superheterodyne receivers require sizeable pre-conversion filters and voluminous, high quality, narrow band IF filters which operate at high frequencies. In light of the difficulty in fabricating high-quality filters at RF frequencies on an IC, these filters are typically built using tuned circuits which require discrete filtering components such as capacitors and inductors. Alternatively, external surface acoustic wave (SAW) filters which are somewhat large, expensive, and lossy are often utilized. Additionally, superheterodyne receivers require high frequency oscillators and mixers which are difficult to integrate on a single IC substrate (especially CMOS) due to noise isolation, power considerations, and resonator Q. Typically, high frequency oscillators and mixers must be provided as discrete components. These discrete components increase the size, materials cost, assembly cost, and power consumption of receivers built utilizing superheterodyne design techniques.

Certain alternative prior art RF transceivers eliminate the need for IF stages for some types of modulation by directly converting the RF signal to a baseband signal. In direct conversion receivers, the RF signal is heterodyned with a Local Oscillator (L.O.) signal having the same frequency and phase as the desired RF signal. Such receivers require that the RF signal be mixed in quadrature for adequate RF signal selection and demodulation. In a direct conversion receiver, locally generated orthogonal carriers must be tuned to the frequency and phase of the incoming signal's carrier (or virtual carrier, as the case may be), and be heterodyned with the incoming signal in two separate mixers in order to obtain zero IF signals and baseband signals. The baseband signals are detected as beats in quadrature between the transmitted carrier frequency signal and local carrier frequency signals in quadrature. The matching of these two mixer characteristics and the phase and amplitude accuracy of the two orthogonal local oscillators signals need narrow tolerance components in order to produce baseband signals which are suitable for demodulation under weak signal conditions; components with such tolerances are more difficult to integrate than those producing only single phase mixing.

Thus, there is a need for a receiver which does not require extensive pre-conversion filtering, quadrature mixing, or expensive high frequency IF filters. Further, there is a need for a receiver architecture which includes components which can be readily integrated with a digital communications control system such as a MAC. There is also a need for a receiver which reliably down-converts the RF signal to a lower frequency signal which can be readily processed by receiver components integrated with the communications control system.

SUMMARY OF THE INVENTION

The present invention relates to a receiver for use in a wireless network upon which information is communicated on a modulated carrier wave at one of a plurality of channel frequencies. The receiver includes an RF band input, a frequency synthesizer, a mixer, a band pass filter, and a decoder. The mixer has an RF input coupled to the RF band signals coming from the antenna, a local oscillator input coupled to the frequency synthesizer to receive a synthesizer signal, and a mixer output. The synthesizer signal has a frequency approximate one of the channel frequencies, and the mixer provides a very low intermediate frequency signal at the mixer output. The very low intermediate frequency signal has a frequency above the peak modulation deviation. The band pass filter has a filter input and a filter output. The filter input is operatively coupled to the mixer output. The decoder is operatively coupled to the filter output and receives a signal corresponding to the very low intermediate frequency signal. The decoder provides a decoded signal indicative of the information on the modulated carrier wave.

The present invention further relates to a receiver for receiving a baseband frequency signal transmitted on a modulated carrier wave having one of a plurality of channel frequencies. The receiver includes an antenna means for receiving the modulated carrier wave, a frequency source means such as a phase locked loop synthesizer for providing a local oscillator signal, an intermediate frequency means (such as a mixer) for receiving the local oscillator signal and the modulated carrier and generating a very low intermediate frequency signal, and a demodulator means for receiving the very low intermediate frequency signal and providing a demodulated signal indicative of the baseband frequency signal transmitted on the modulated carrier wave. The local oscillator signal has a frequency approximate the one of the channel frequencies, and the very low intermediate frequency signal has a frequency above the peak modulation deviation.

The present invention further relates to a method of receiving information on a modulated carrier wave having one of a plurality of channel frequencies for use in a wireless network. The method includes the steps of receiving the modulated carrier wave signal, amplifying the modulated carrier wave signal to generate an amplified modulated carrier signal, generating a mixing signal (local oscillator) having a frequency approximate the one of the channel frequencies, mixing the mixing signal and the amplified modulated carrier signal to form a very low intermediate frequency signal having a frequency above the peak modulation deviation and important sidebands, and demodulating a result signal related to the very low intermediate frequency signal to obtain the information on the modulated carrier wave.

In one aspect of the present invention, the receiver directly converts the radio frequency (RF) signal to a very low intermediate frequency (IF) signal (e.g., to a frequency between the peak modulation deviation and considerably less than the channel interval). The receiver preferably operates to down-convert a high frequency electromagnetic signal such as 2.4–2.5 GHz RF signal to a 340–660 kHz signal (depending on the symbol or bit pattern being transmitted via frequency shift keyed (FSK) modulation). The receiver may be used in a variety of applications such as cordless telephones, wireless networks, or other radio devices, and with a variety of radio frequencies and modulation techniques.

In another aspect of the present invention, the transceiver does not require pre-conversion filtering. The receiver mixes the carrier wave or RF signal with a synthesizer signal or mixing signal having a frequency one-half of a channel interval above the RF signal. Alternatively, the synthesizer signal may have a frequency of some other fraction of the channel interval of the RF signal. The mixer advantageously provides a very low IF signal having a frequency higher than the sum of the highest frequency contained in the baseband information and the peak deviation, yet well below the channel spacing interval. Preferably, the very low intermediate frequency is low enough to eliminate the need for pre-conversion filtering or image reject phasing and yet high enough to reliably include the baseband signal.

In still another aspect of the present invention, the very low IF transceiver architecture allows a significant number of transceiver components to be integrated with the digital communication control system. An integrated audio band pass filter advantageously filters the very low IF signal to eliminate components from other channels at the receiver front end. The very low IF signal can be reliably demodulated without requiring quadrature mixing. Further, the advantageous architecture allows high gain amplification to be performed in a relatively quiet region of the frequency spectrum by an integrated amplifier.

BRIEF DESCRIPTION OF THE DRAWINGS

The invention will hereafter be described with reference to the accompanying drawings, wherein like numerals denote like elements, and.

DETAILED DESCRIPTION OF PREFERRED EXEMPLARY EMBODIMENTS OF THE PRESENT INVENTION

Figure 1:
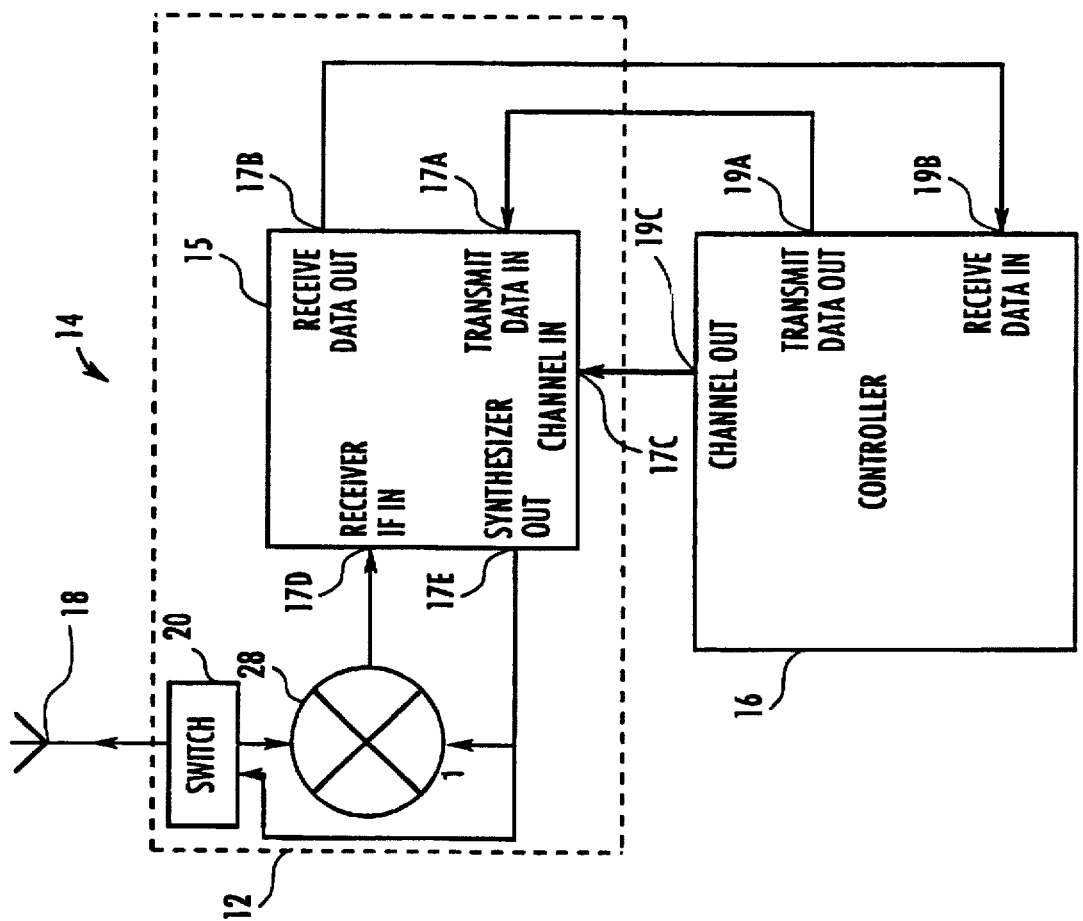
FIG. 1 is a general block diagram of a communications system node including a transceiver and a communications control system in accordance with a first exemplary embodiment of the present invention.

FIG. 1 is a general block diagram of a communications system node 14 such as a wireless network (not shown), cordless telephone or other radio frequency (RF) device. System node 14 is preferably part of a wide area network (WAN), cellular network or wireless LAN such as an IEEE 802.11 standard radio LAN or other radio frequency application such as a cordless or wireless telephone system.

Alternatively, communications system node 14 may be utilized in other RF communication apparatus.

System node 14 preferably operates at a radio frequency between 2.4 and 2.5 GHz at channel intervals of 1 MHz. Information is preferably modulated with two or four level Gaussian frequency shift keyed (GFSK) modulation having a peak deviation of +/−160 KHz of the RF signal or carrier wave. Symbols representing the information are preferably encoded as periods of +160 KHz to −160 KHz of frequency deviation (e.g., a peak-to-peak deviation of 320 KHz) at a data rate of 1 Megabit per second (2-level) or 2 Megabits per second (4-level). Alternatively, the information may be amplitude modulated, phase modulated, or otherwise encoded on the RF signal.

Communications system node 14 includes a radio transceiver 12, a communications control system or controller 16, and an antenna 18. The antenna may be incorporated directly into transceiver 12. Communications controller 16 is preferably a communications controller or media access controller (MAC) such as an Am79C930 PC Net Wireless™ MAC device or other generation MAC device manufactured by Advanced Micro Devices, Sunnyvale, Calif. Communications controller 16 is preferably a single substrate, integrated digital controller with a plurality of inputs and outputs, such as a transmit data output 19A, a receive data input 19B, and a channel selection output 19C. Controller 16 is preferably fabricated in CMOS and is operable in a variety of communications applications.

In the simplest exemplary embodiment, radio transceiver 12 includes a mixer 28, a transmit/receive ("T/R") switch 20 and the remaining receiver and transmitter circuitry in a module or circuit 15. Circuit 15 includes a transmit data input 17A, a receive data output 17B, a channel selection input 17C, a receiver IF input terminal 17D, and a local oscillator ("LO") synthesizer output 17E. An RF input of mixer 28 is coupled to antenna 18 through the T/R switch 20. The LO input of mixer 28 is coupled to the LO synthesizer output 17E. An IF output of mixer 28 is coupled to the receiver IF input 17D. The LO synthesizer output 17E is also connected to the transmit terminal of the T/R switch, often through a power amplifier (not shown) whose gain may or may not be amplitude modulated. Transmit data input 17A is coupled to transmit data output 19A, and receive data output 17B is coupled to receive data input 19B. Also not shown could be a bandpass filter connected between the antenna 18 and the T/R switch 20, whose purpose is to confine the signals passing in either direction to those in the frequency band of interest. Channel selection output 19C is coupled to channel selection input 17C. Also not shown could be a receiver preamplifier connected between the T/R switch 20 receive output and the mixer 28 RF input, whose purpose is to help provide adequate receiver sensitivity. Preferably, a number of components in transceiver 12 are integrated on the semiconductor substrate of controller 16.

In operation, transceiver 12 performs RF, IF, modulation and demodulation signal processing for communication system node 14. In the receive mode, antenna 18 receives a modulated carrier wave or RF signal and provides same to mixer 28 through T/R switch 20. The LO synthesizer contained in circuit 15 provides a mixing signal to 17E corresponding to a selected channel in the appropriate frequency range (such as between 2.4 and 2.5 GHz at 1 MHz channel intervals). The synthesizer signal corresponds to a channel selection signal provided by the controller 16 at output 19C to input 17C of 15. In the receive mode, the LO synthesizer signal provided at output 17E is preferably one-half of the channel interval above the carrier, or center, frequency of the selected channel. For example, if the desired RF signal is centered on 2433 MHz, the LO synthesizer is set to 2433.5 MHz in accordance with the channel selection signal at output 19C. Alternatively, the LO synthesizer's frequency may be offset below the center frequency of the desired RF signal by one-half the channel interval, or related to the channel interval by a different ratio such as one quarter. This amount of the LO synthesizer's offset must be greater than the highest significant frequency component (measured as the difference in frequency between the sideband energy and the carrier) contained in the sidebands of the incoming modulated carrier wave. For example, in this exemplary embodiment, significant sideband energy extends to almost plus and minus 500 KHz from the carrier frequency. Thus, in the receive mode an LO synthesizer offset of 500 KHz (half the channel width) was chosen.

Mixer 28 provides essentially the multiplicative product of the signals from its two inputs to receiver IF input 17D, which works out to be replicas of the RF signal at frequencies which are the sum and difference of it and the LO. Depending upon its exact design, the mixer also provides the original signals, preferably at reduced level. Only the difference frequency will be discussed here, as the other three frequency components are removed by the first component after the IF input 17D. This difference frequency is the very low IF signal, which extends from nearly DC to nearly 1 MHz, corresponding to sidebands from nearly 500 KHz plus and minus the carrier frequency, respectively.

There are at least two effects of utilizing such a low intermediate frequency. The positive effect is that the signal can be processed (i.e. filtered, amplified, further heterodyned) by relatively inexpensive and compact integrated circuitry and other circuitry. The negative effect is that appearing at receiver IF input 17D with equivalent frequency and amplitude response will also be any signals in the RF input band appearing at antenna 18 which are above the LO frequency emanating from 17E; as these signals will differ in frequency by the same amounts as those below the LO. Any low pass filter following input 17D whose bandpass cutoff is just below 1 MHz will tend to eliminate all signals which were more than 1 MHz below the LO frequency and all signals which were more than 1 MHz above the LO frequency; signals on the desired channel will be passed unattenuated, but so, also, will be signals on the next higher channel. The superheterodyne receiver mixing process always provides equal response to the desired signal band and this undesired image band. The usual design strategy is to place the LO frequency significantly far from the desired RF input frequency so that the image band can be removed by filtering prior to the mixer 28. In the case of this particular design, the LO frequency is so close (in fact, just far enough away to avoid all modulation sidebands) that the image band is immediately adjacent to the desired signal at all times and thus cannot be filtered out prior to the mixer by any known practical method. However, responses to this and any image band can be reduced through the use of image reject mixing.

This situation is normally considered to be intolerable, but in some circumstances (including the one for which this receiver was designed), the required (or specified) receiver system selectivity permits full passband response to the adjacent channels (usually to lower the cost of selectivity elements). For this design, even though the image rejection ratio is 0 dB, this is not a problem; as the image band is always at one of the adjacent channels. The particular specification is the upcoming IEEE P802.11 Wireless LAN standard, but this idea applies to any selectivity specification or band plan, official or otherwise, which allows zero selectivity for enough bandwidth to include the carrier and both sidebands.

This very low intermediate frequency should be above DC (zero Hz) and yet low enough so as not to require expensive IF filters and other components. Further, the very low intermediate frequency should be large enough to include the full range of the baseband frequency. Thus, circuit 15 is designed to cause mixer 28 to convert the RF signal to a very low IF signal which can be reliably processed to obtain the information encoded at the baseband frequency or modulated on the radio frequency.

Circuit 15 filters, amplifies, otherwise processes, and decodes the very low IF signal to produce a receive data signal at output 17B indicative of the information modulated at the baseband frequency on the RF signal received by antenna 18. The received data is received by communications controller module 16 at receive data input 19B. The received data can be a serial or parallel digital bit stream, pulse signal, or analog signal representing the symbols or information modulated on the RF signal.

In the transmit mode, communications controller module 16 provides transmit data at transmit data output 19A to transmit data input 17A of circuit 15. The transmit data can be a bit stream, pulse signal or analog signal representing signals or information to be modulated on the RF signal. The transmit digital data entering circuit 15 at 17C modulates the voltage controller oscillator (VCO) within the synthesizer; so that the latter's output at output 17E is frequency-shift-key (FSK) modulated, instead of unmodulated as was required for the receive mode. This modulated signal is sent 17E to the TR Switch 20, sometimes through a power amplifier (not shown), which in this transmit mode is set to connect the modulated signal to the antenna.

Figure 2:
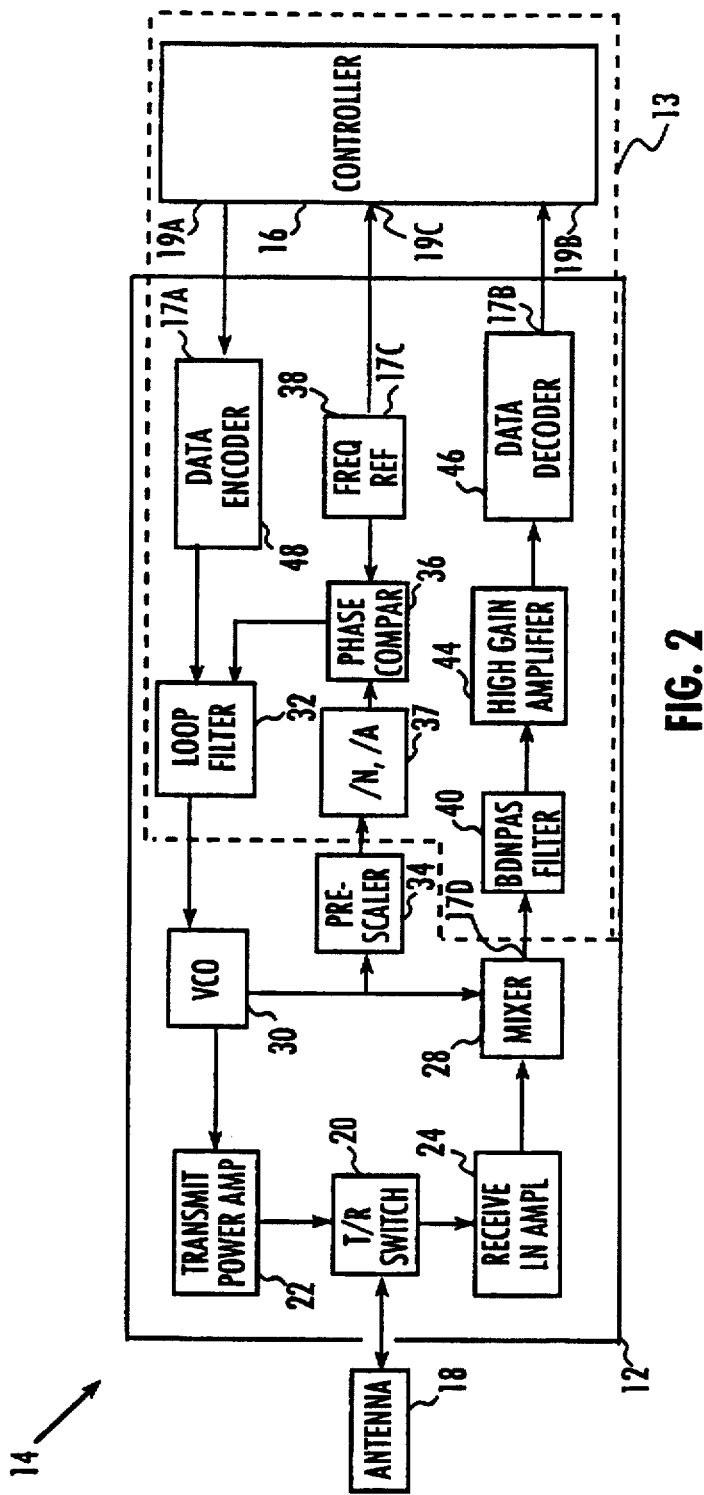
FIG. 2 is a more detailed block diagram of the communications system node illustrated in FIG. 1 in accordance with a second exemplary embodiment of the present invention.

FIG. 2 is a schematic block diagram of transceiver 12 for use in communications system node 14 in accordance with a second exemplary embodiment of the present invention. Communications system node 14 includes antenna 18, transceiver 12 and media access controller (MAC) or communications controller 16. Transceiver 12 includes a transmit/ receive switch 20, a transmit power amplifier 22, a receive low noise amplifier 24, a mixer 28, a voltage controlled oscillator 30, a loop filter 32, a prescaler 34, /N/A 37, a phase comparator 36, a frequency reference generator 38, a band pass filter 40, a high gain amplifier 44, a data decoder 46, and a data encoder 48. Preferably, filter 32, /N/A 37, phase comparator 36, reference frequency generator 38, band pass filter 40, high gain amplifier 44, data decoder 46, and data encoder 48 are integrated in CMOS with controller 16 on a single integrated circuit substrate 13.

Transceiver 12 and communications system node 14 are configured to utilize GFSK modulation to transmit information over the wireless network (not shown). Transceiver 12 is a frequency hopping device which receives a channel selection signal in accordance with the IEEE 802.11 standard. VCO 30, loop filter 32, prescaler 34, /N/A 37, and phase comparator 36 cooperate to form a phase locked loop frequency synthesizer capable of producing high frequency (RF) signals for antenna 18 and mixer 28. For example, VCO 30, prescaler 34, /N/A 37, phase comparator 36, and loop filter 32 are preferably arranged to provide any channel frequency to mixer 28 from 2.3995 to 2.4995 GHz in 1.0 MHz steps in Receive mode and any channel frequency to Transmit Power Amplifier 30 from 2.4 GHz to 2.5 GHz in 1 MHz steps in Transmit mode. VCO 30, transmit power amplifier 22, and T/R switch 20 preferably provide the RF signal directly to antenna 18.

The operation of transceiver 12 is discussed below with reference to FIG. 2 as follows. In the receive mode, antenna 18 receives a modulated carrier wave signal or RF signal at any 1 MHz channel between 2.4 and 2.5 GHz (e.g., one of 100 channels). Transmit and receive switch 20 is set to receive by controller 16 so that the signals on antenna 18 are provided to the receive low noise amplifier 24. Switch 20 also prevents signals from being reflected through transmit power amplifier 22 from mixer 28 to antenna 18. Switch 20 is preferably a Silicon (Si) or Gallium Arsenide (GAs) device having less than 1 microsecond operation time. Switch 20 is preferably controlled by controller 16 in accordance with a IEEE 802.11 standard protocol.

Antenna 18, or its matching circuit normally provides some RF filtering for system node 14 and is tuned to the 2.4 to 2.5 GHz range. Antenna 18 can be a printed circuit antenna mounted on a PCMCIA card or other printed circuit board. Antenna 18 is impedance matched, in some instances by microstrip techniques. Antenna 18 and transceiver 12 generally have a 200–300 foot indoor range for receiving and transmitting the RF signal. Between antenna 18 and T/R switch 20 may be a low cost ceramic or other type filter (not shown) for increased RF filtering capabilities.

Switch 20 provides the modulated carrier wave (RF signal) to low noise receive amplifier 24, which amplifies the modulated carrier wave and establishes the receiver system noise figure. Amplifier 24 provides the amplified RF signal to mixer 28. Preferably, amplifier 24 is a low noise amplifier having a maximum noise figure of less than 5 dB. Preferably, amplifier 24 has a large reverse isolation for reducing the leakage of the VCO 30 signal and prescaler 34 noise back through the mixer 28 and T/R switch 20 and into antenna 18 during receive mode. Amplifier 24 preferably has a gain of 10 to 15 dB.

VCO 30, loop filter 32, prescaler 34, /N/A 37 and phase comparator 36 cooperate to provide a synthesizer or local oscillator (L.O.) mixing signal to mixer 28. The mixing signal has a frequency of 0.5 MHz (e.g., ½ of the channel interval) above the desired channel frequency which is being tuned. Alternatively, the mixing signal may be below the desired frequency. The mixing signal is preferably close enough to the desired channel frequency so that mixer 28 produces a very low intermediate frequency signal which is above DC and below approximately 1 MHz. In addition to receiving the desired signal centered at 0.5 MHz below the mixing signal frequency (or 0.5 MHz above the mixing signal frequency if the latter has been placed 0.5 MHz below the desired carrier frequency) appearing at the IF with identical response will be any signals at the channel centered at 0.5 MHz above the mixing signal frequency, as this is the image band. In other words, the image band delivers virtually identical signals to the IF, and the image rejection is 0 dB because the RF filtering is much too wide to provide rejection. While this state of affairs is normally intolerable, it is perfectly acceptable in this case; inasmuch as the applicable IEEE P802.11 specification (as well as other possible specifications) provides for 0 dB selectivity at the channels immediately adjacent to the desired channel.

VCO 30 produces the appropriate mixing signal in response to a stable reference oscillating signal of 500 KHz derived within generator 38, and a channel selection signal from controller 16 received by dividers /N/A 37 contained in prescaler 34. The phase lock loop (PLL) synthesizer configuration of prescaler 34, /N/A 37, phase comparator 36 and loop filter 32 allows VCO 30 to accurately and efficiently produce the mixing signal for mixer 28.

Mixer 28 provides the very low intermediate frequency signal to band pass filter 40. Mixer 28 can be a bi-directional passive mixer constructed of a plurality of diodes. Alternatively, mixer 28 can be an active mixer constructed of transistors having a conversion gain, or other types of active devices. Band pass filter 40 may be an audio frequency band pass filter which is integrated with substrate 13. Band pass filter 40 operates to advantageously remove other channels received by antenna 18, including all the image channels except the one adjacent to the desired channel, without the use of an extensive high frequency preconversion filter. Filter 40 preferably has a center frequency of 500 KHz. Band pass filter 40 provides a filtered signal to high gain amplifier 44 which is AC coupled with band pass filter 40. High gain amplifier 44 is easily integrated on substrate 13 because of the relatively low frequency of the very low IF signal.

The filtered and amplified very low IF signal is provided to data decoder 46, which demodulates or decodes the signal from amplifier 44 and provides a data and clock signal to controller 16 indicative of the information encoded or modulated on the RF signal. Decoder 46 and amplifier 44 may include automatic gain control circuitry for more accurate demodulation.

In the transmit mode, controller 16 provides combined data and clock signal to data encoder 48. Data encoder 48 provides a baseband signal to loop filter 32 so VCO 30 provides a directly modulated signal to transmit power amplifier 22. In the transmit mode, VCO 30, loop filter 32, phase comparator 36, /N/A 37, and prescaler 34 preferably cooperate to produce the modulated carrier wave (RF signal) at the exact center frequency of the selected channel. Preferably, loop filter 32 has a sufficiently low cutoff frequency to allow VCO 30 to be modulated directly by applying a baseband signal at filter 32 via encoder 48.

Controller 16 selects the desired channels for transmitting and receiving the RF signal via dividers /N/A 37. Controller 16 provides the channel selection signal or other data so that the dividers /N/A 37 can properly select local oscillator frequency in 0.5 MHz steps at each integral MHz and half MHz. In the transmit mode, controller 16 provides the channel selection data to the dividers /N/A 37 so RF signals at every integral 1 MHz can be chosen. In the receive mode, controller 16 provides the channel selection data to the dividers /N/A 37 so that VCO 30 provides a mixing or synthesizer signal having a frequency of 0.5 MHz greater than the integral MHz desired frequency of the modulated carrier wave.

Preferably, loop filter 32, the dividers /N/A 37, phase comparator 36, frequency source 38, data encoder 48, data decoder 46, band pass filter 40, and high gain amplifier 44 are integrated with the controller 16 on substrate 13. The above components can easily be integrated with controller 16 because most operate at the very low intermediate frequency rather than a high frequency RF signal. Generator 38 includes a crystal oscillator coupled with an off-chip crystal (not shown). This oscillator provides a clock reference for the communications controller 16. Generator 38 includes an internal divider (not shown) for lowering the frequency of the crystal to 500 KHz for the reference input of the phase comparator 36.

Figure 3:
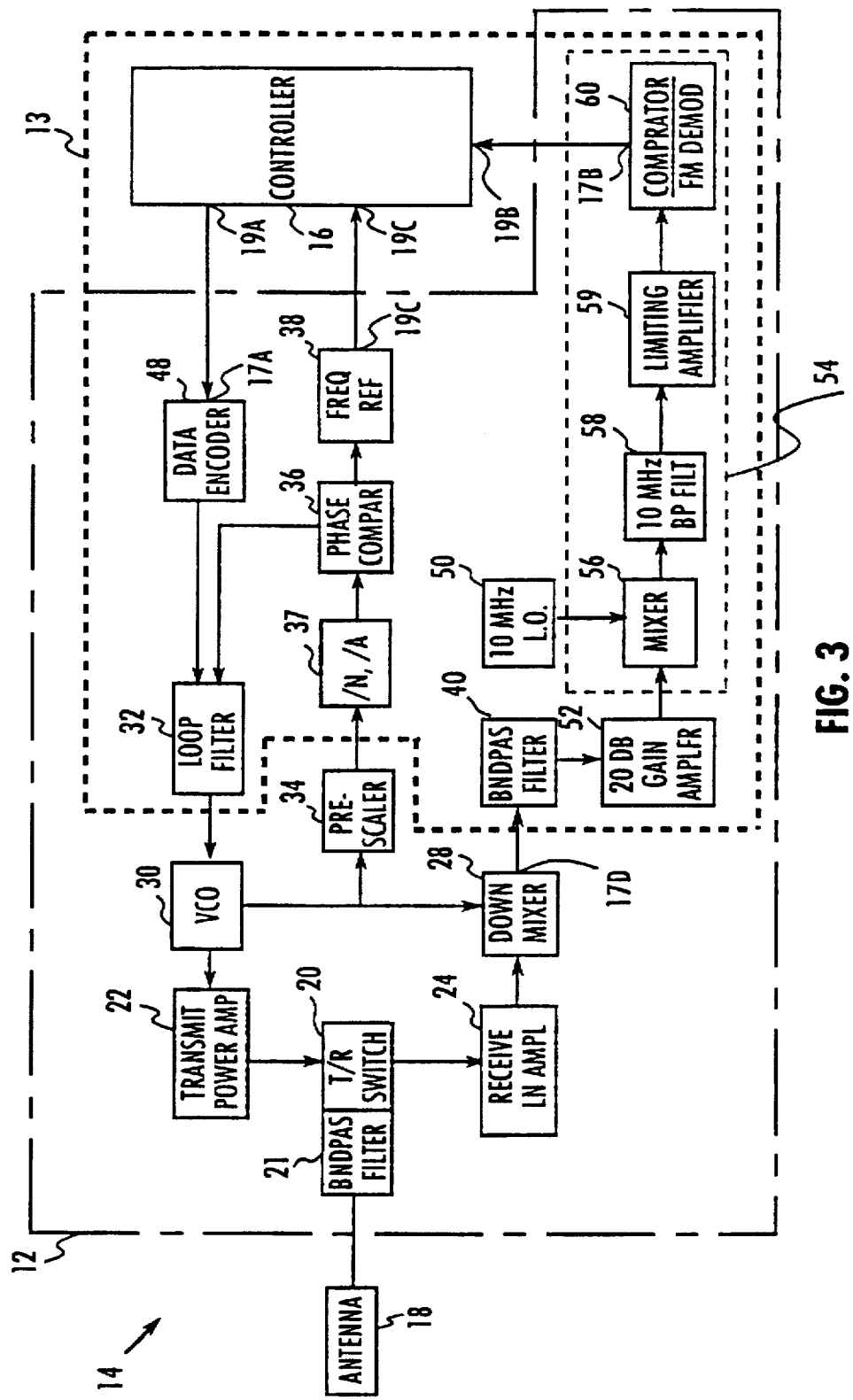
FIG. 3 is a block diagram of the communications system node in accordance with a third exemplary embodiment of the present invention.

With reference to FIG. 3, system node 14 is similar to system node 14 illustrated in FIG. 2. FIG. 3 shows more detail; the bandpass filter 21, the prescaler 34 and dividers 37 are in separate blocks, and the bandpass filter 21 is shown explicitly. Transceiver 12 is similar to the one in FIG. 2, except that it handles the receiver IF differently. Transceiver 12 includes a prescaler 34, a divider 37, a local oscillator 50, bandpass filter 21, an amplifier 52 and an receiver back end processor 54. Receiver back end processor 54 includes a mixer 56, a band pass filter 58, a limiting amplifier 60 and an FM demodulator 60. Transceiver 12 operates substantially similar to transceiver 12 illustrated in FIG. 2 in the transmit mode.

Bandpass filter 40 is an audio filter having a center frequency of 500 KHz. Alternatively, filter 40 may be a combination of switched capacitive filters or high and low pass filters. The relatively low center frequency of filter 40 allows filter 40 to be more easily integrated on substrate 13.

In the receive mode, transceiver 12 operates substantially similar to transceiver 12 illustrated in FIGS. 1 and 2 up to the output of band pass filter 40. The very low intermediate frequency filtered by band pass filter 40 is amplified by amplifier 52 which preferably has a gain of 10–20 dB. Filter 40 allows only the very low IF signal and a close image signal to pass through to amplifier 52. (It is understood that the communications standard for which this receiver will be used allows for zero selectivity of the adjacent channels, or that the channel spacing is wide enough so that no interference will occur in the image band. Amplifier 52 has a low enough gain so that limiting of the very low IF signal is prevented. Preferably, the magnitude of the gain is chosen to be high enough to minimize the noise on the very low IF signal and yet not limit the very low IF signal.

Mixer 56 receives the amplified very low IF signal and heterodynes the very low IF signal with a mixing signal from oscillator 50. Oscillator 50 is a CMOS squarewave oscillator for generating a 10 MHz signal in response to a 20 MHz or other convenient frequency signal associated with the off chip crystal (not shown) coupled to generator 38. Mixer 56 provides an up-converted IF signal to band pass filter 58. Mixer 58 is preferably an active mixer. Band pass filter 58 has a center frequency of 10.5 MHz. The signal provided by mixer 56 has a frequency of just above 10.0 MHz to just below 11 MHz depending upon the symbols or bit pattern (e.g., information) encoded on the RF signal received by antenna 18.

By up-converting the very low IF signal, the RF signal can be more reliably decoded. Particularly with an FM signal, which includes information transmitting at a rate of 1 Mbits per second or 2 Mbits per second, the up-converted IF signal provides at least 5–10 full cycles for each bit received by antenna 18. The up-converted IF signal preferably has a frequency low enough to be handled efficiently by high gain, low power circuitry such as filter 58 and amplifier 59 which can be integrated on substrate 13 of controller 16. Limiting amplifier 60 amplifies the up-converted IF signal and additionally limits the amplitude of the up-converted IF signal. Limiting amplifier 60 and up-conversion circuit 54 advantageously eliminate the need for automatic gain control circuitry because demodulator 60 receives at least several cycles of the up-converted IF signal per symbol or bit.

FM demodulator 60 is preferably a phase shift network or fast phase lock loop. Preferably, FM demodulator 60 is a fast phase lock loop which does not require an external resonator. Demodulator 60 provides the demodulated signal at output 17D to received data input 19B of controller 16.

Figure 4:
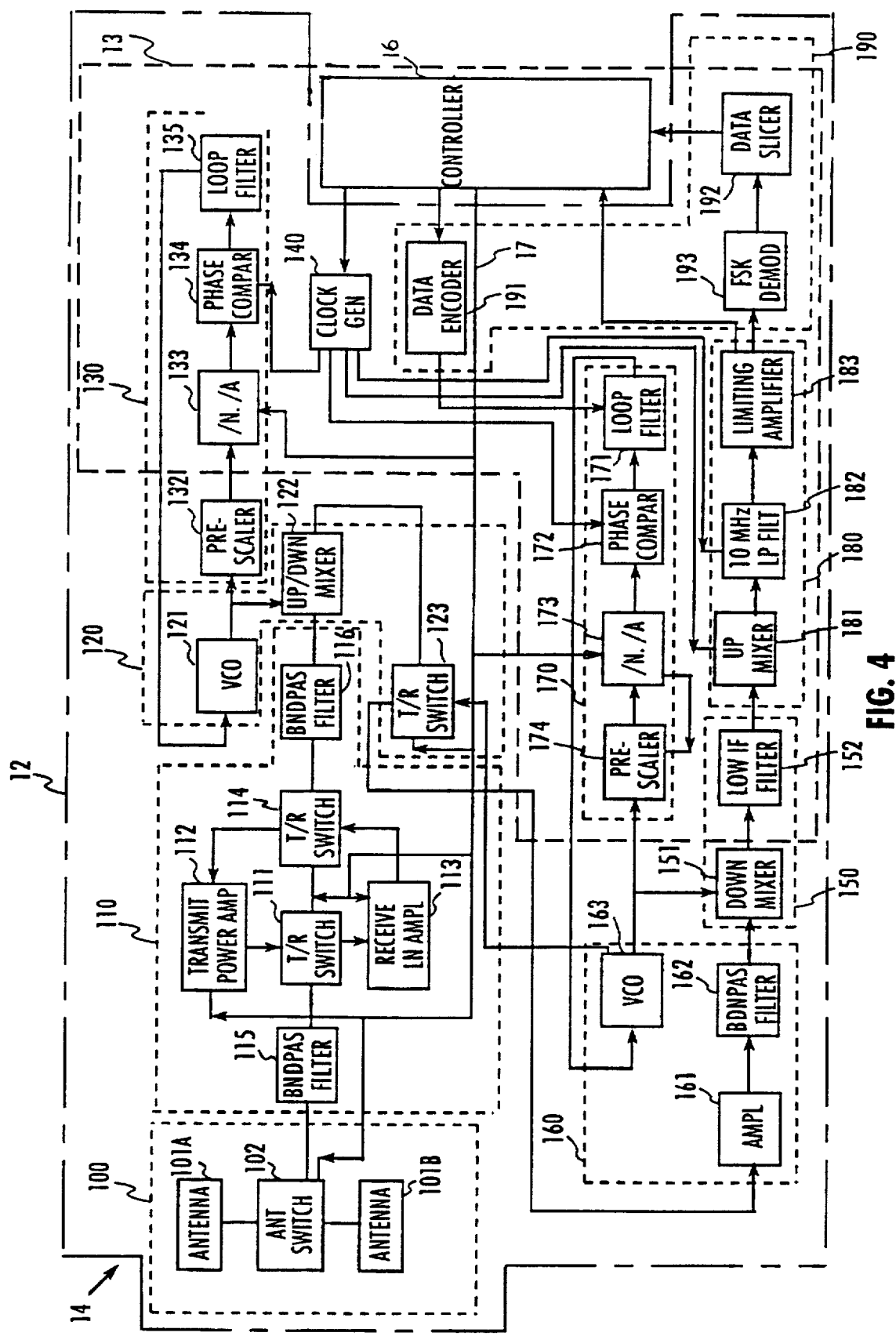
FIG. 4 is a detailed block diagram of a communications system node in accordance with a fourth exemplary embodiment of the present invention.

With reference to FIG. 4, transceiver 12 operates similar to the transceiver 12 illustrated in FIG. 3; however, transceiver 12 converts the RF signal to a very low IF signal only after it first converts the RF signal to a more commonly used IF range. The major purpose for this system architecture variation is to make it easier to avoid leakage of the local oscillator signal to the antenna while in receive mode. In the previous designs, the local oscillator is so close in frequency to the desired signal that it normally cannot be adequately filtered to meet the regulator requirements of maximum allowed level before it reaches the antenna. With reference to FIG. 4, a detailed block diagram of a communication system node 14 includes transceiver 12 and controller 16. Transceiver 12 includes a microwave synthesizer 130, a clock generator 140, data encoder/decoder 190, a UHF synthesizer 170, a diversity antenna system 100, a transmit/ receive microwave amplifier circuit 110, a microwave converter stage 120, a UHF converter module 160 a low IF down converter 150, and a 9.5 MHz high gain IF system 180. Integrated on substrate 13 with controller 16 are circuits 190, 140, 170, 180, most of circuit 130, and part of circuit 150. Controller 16 is coupled to circuits 170, 130, 120, 110, and 100 via a control bus 17.

The operation of system node 14 is discussed below with reference to FIG. 4. In the transmit mode, controller 16 provides transmit data to data encoder 191. Synthesizer 170 produces an approximately 250 MHz GFSK modulated signal in accordance with the information received by data encoder 191. Synthesizer 170 provides the 250 MHz modulated signal to microwave converter stage 120. Synthesizer 170 can produce the IF signal at a frequency of 250 to 255 MHz in 0.5 MHz steps. The frequency produced by synthesizer 170 is controlled by controller 16 via channel selection signals on a control bus 17. Synthesizer 170 is preferably a phase lock loop synthesizer coupled to an off-chip VCO.

Microwave converter stage 120 mixes the 250 MHz modulated signal with a 2.15 to 2.25 GHz signal from synthesizer 130. Synthesizer 130 is capable of providing 2.15 to 2.25 GHz local oscillator signal in 5 MHz steps. Microwave converter stage 120 mixes the synthesizer signal and the 250 MHz modulated signal for a 2.4 to 2.5 GHz modulated RF signal in 0.5 MHz steps to transmit/receive microwave amplifier circuit 110. Transmit/receive microwave amplifier circuit 110 filters and amplifies the RF signal from microwave converter stage 120. Diversity antenna circuit 100 receives the RF signal from transmit/receive microwave amplifier circuit 110 and transmits the RF signal through the diversity antenna system 100 and over the air.

Synthesizer 130 provides the 2.15 to 2.25 GHz signal in response to a channel selection signal provided on control bus 17. Controller 16 coordinates the operation of synthesizer 170 and synthesizer 130 so that the information is properly modulated on a selected or desired channel. Encoder 191 may be a basic two level encoder for the one Mbit/sec mode or a four level encoder for the two Mbit/sec mode. The arrangement of synthesizer 170 and synthesizer 130 allows any signal between 2.4 and 2.505 GHz at 0.5 MHz intervals to be provided by microwave converter stage 120 with only a 5 MHz frequency variation range of synthesizer 170 and a 100 MHz frequency variation range for synthesizer 130.

In the receive mode, diversity antenna system 100 receives an RF signal which is filtered and amplified by transmit/receive microwave amplifier circuit 100. Microwave converter stage 120 down-converts the RF signal from between 2.4 and 2.5 GHz to approximately 250 MHz in response to the 2.15 to 2.25 GHz signal from synthesizer 130. Microwave converter stage 120 provides the approximately 250 MHz first IF signal to UHF converter module 160. UHF converter module 160 provides the first IF signal to the low IF down converter 150.

The low IF down converter 150 down converts the approximately 250 MHz first IF signal to a very low IF frequency such as between 0 and 1 MHz, or between a baseband and a channel interval. Synthesizer 170 provides a 250 to 254.5 MHz signal at 0.5 MHz steps to properly select the desired channel from the first IF signal. The very low IF signal is provided to a low pass IF filter 152.

By down-converting the first IF to a very low IF stage rather than to a second IF at about 10 MHz, as in conventional transceivers, the image band is moved from 20 MHz away to 1 MHz away at the next channel, where the IEEE P802.11 specifications says that no selectivity is required. Thus, a significant image reject filter in the 250 MHz range is eliminated, and only a simple band pass filter 152 is required to reduce the power of all signals and noise outside the 250 MHz to 254.5 MHz IF range. Low pass filter 152 advantageously blocks all direct and image energy above 1 MHz.

Further, this very low IF method allows expensive IF channel filtering to be eliminated. Such filters often require a large amount of power. Preferably, the frequency of the first IF signal (e.g., the approximately 250 MHz signal) is low enough so that the filters in the first IF stage 120 are low cost and yet high enough so that the synthesizer signals and image bands are well into the stop bands of the RF filters in the transmit/receive microwave amplifier circuit 110.

The very low IF signal centered on 0.5 MHz coming from the low IF down converter 150 is heterodyned by a 10 MHz local oscillator signal coming from the clock generator 140 to a band centered on 9.5 MHz in the high gain IF system 180, then filtered and amplified therein. The data encoder/ decoder module 190 demodulates the signal, decides on bit values, and feeds digital data to controller 16.

With further reference to FIG. 4, a more detailed description is given herein. Diversity antenna circuit 100 includes an antenna 101A and an antenna 101B coupled to an antenna switch 102. Controller 16 selects the antenna 101A or 101B in the beginning of each received transmission or packet in accordance with estimations of received signal quality. Antenna switch 102 is controlled via control bus 17 by controller 16. Antenna switch is coupled to a band pass filter 115 which is coupled to a transmit/receive switch 111.

In transmit and receive circuit 110, a transmit power amplifier 112 and receive linear low noise amplifier 112 are coupled to a transmit receive switch 111 and a transmit receive switch 114. A band pass filter 116 is coupled to transmit and receive switch 114 and bi-directional up/down mixer 122. Bi-directional up/down mixer 122 is coupled to transmit and receive switch 123. Transmit and receive switches 111, 114, and 123 are controlled by controller 16 via control bus 17. Similarly, amplifier 112 and amplifier 113 are controlled by controller 16 via control bus 17.

Synthesizer 130 is coupled to voltage controlled oscillator (VCO) 121, and includes a prescaler 132, a divider 133, a phase comparator 134, and a loop filter 131, which receives a clock signal from clock signal generator 140, receives a channel selection signal from control bus 17 and cooperate to cause VCO 121 to produce a 2.15 to 2.25 GHz signal for use by mixer 122. In receive mode, mixer 122 provides the first IF signal through transmit and receive switch 124 to amplifier 161; in transmit mode, mixer 122 up converts the signal from VCO 163 to the 2.4 GHz band and delivers it to bandpass filter 116. Amplifier 161 is low gain stage that helps maintain the overall receiver system noise figure and provides correct termination for mixer 122.

The UHF converter module 160 also includes a band pass filter 162 and the VCO 163. Synthesizer 170 includes a prescaler 174, a divider 173, a phase comparator 172, and a loop filter 171. The low IF converter module 150 includes a down mixer 151 and low IF filter 152. The 9.5 MHz high gain IF module 180 includes a mixer 181, a low pass filter 182, and a limiting amplifier 183. The data encoder/decoder 190 includes FSK demodulator 193, data slicer 192, and data encoder 191.

The operation of transceiver is as follows. Transmit receive switch 123 ensures that up/down mixer 122 is coupled to VCO 163 in transmit mode and IF amplifier 161 in receive mode. The transmit receive switches 111 and 114 ensure that the transmit power amplifier 112 is in the signal path for transmit mode and that the low noise amplifier 113 is in the signal path for receive mode. The up/down mixer 122 and all remaining blocks in the transmit/receive microwave amplifier circuit 110 and diversity antenna system 100 pass signals equally well in either direction; so they can be used for both transmit and receive modes without further switching. In receive mode, prescaler 174, divider 173, phase comparator 172 and loop filter 171 cooperate with VCO 163 to provide an appropriate mixing signal to mixer 151 between 250 and 254.5 MHz signal at 0.5 MHz steps in response to a channel selection signal on control bus 17. In transmit mode, the same UHF synthesizer 170 controls the same VCO 163, in this case as a modulated signal source, centered on frequencies in 1 MHz steps from 250 MHz to 254 MHz, as needed for the appropriate 2.4 GHz to 2.5 GHz channel of operation.

Band pass filter 162 is utilized in the receive mode to minimize the overloading mixer 122. Preferably, band pass filter 162 has a flat response within 1 dB from 249 to 255 MHz. Filter 152 is the principal receiver selectivity element for system 16.

Synthesizers 130 and 170 advantageously are designed as digital dual modulus phase lock loop (PLL) synthesizers. By dividing the channeling task between the two synthesizers instead of utilizing UHF synthesizer 170 at a fixed frequency the following advantage is obtained. The microwave synthesizer 120 is far less critical in design and easier to realize as a high speed channel changing frequency source. This is because the synthesizer channel spacing (and therefore the reference frequency present at the phase comparator 134 inputs) is 6 MHz (furnished by the clock generator 140) instead of 0.5 MHz. The 0.5 MHz spacing is handled by the much lower frequency 250 MHz UHF synthesizer 170, a much easier task. Such rapid synthesizer channel switching allows more time to check reception with the receiver local oscillator at both above and below the desired signal's incoming channel. This procedure would avoid adjacent channel interference (which is this design's overall scheme ends up as an image) present on only one side of the desired signal's channel.

Figure 5:
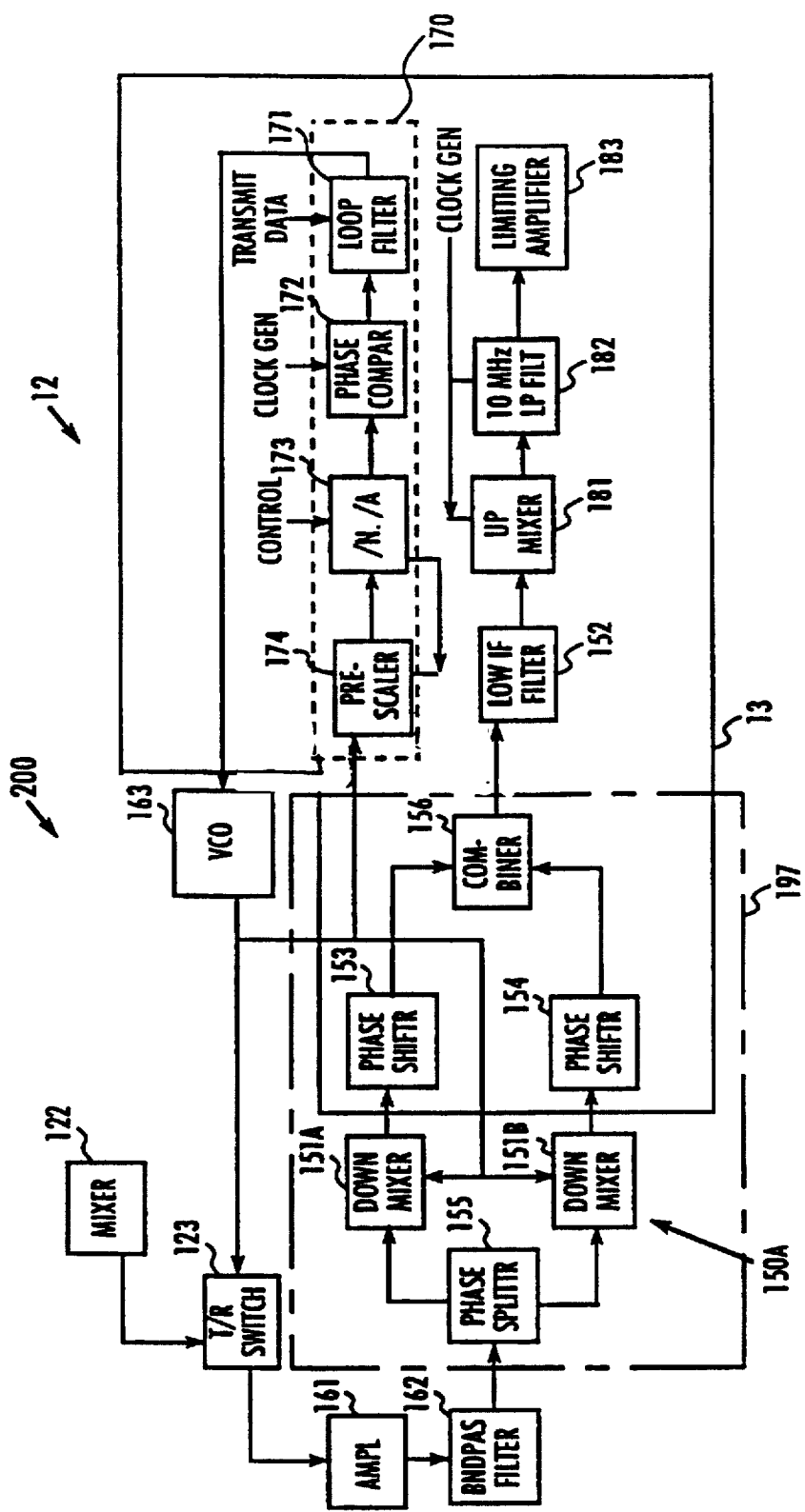
FIG. 5 is an image rejection circuit for use in the communication system nodes illustrated in FIGS. 1, 2, and 3 according to fifth and sixth exemplary embodiments of the present invention.

With reference to FIG. 5, an optional image rejection mixer circuit 150A for use in a system node 200 similar to node 14 illustrated in FIG. 4, is shown coupled between bandpass filter 162 and low pass filter 152. Image rejection circuit 150A replaces the operation of down mixer 151 in node 14 illustrated in FIG. 4. Circuit 150A includes a phase splitter 155, a down mixer 151B, a down mixer 151A, a phase shifter 153, and a phase shifter 154. Mixers 151B and 151A receive a 250 to 254.5 MHz IF signal from VCO 155. Phase splitter 155 operates to split the approximately 250 MHz IF signal from bandpass filter 162 into two signals 90° out of phase from each other. Mixers 151B and 155A convert the approximately 250 MHz IF signals to a very low IF frequency. Phase shifters 153 and 154 shift the phase of the very low IF signals 90° from each other. The signals from the phase shifters 153 and 154 are combined in combiner 156 and provided to low pass filter 152. These functional blocks in image rejection mixer 150A cooperate to obtain the following result in combiner 156: The 250 MHz IF signals and noise which are lower in frequency than the local oscillator source coming from VCO 163 will be enhanced by 3 dB relative to the simple mixer 151 in FIG. 4, and all 250 MHz IF signals and noise which are higher in frequency than the local oscillator coming from VCO 163 will be canceled by an amount dependent upon the relative amplification matching and phase shift accuracy in its two branches. Thus, a certain amount of image rejection is obtained, which in the subject application provides a certain amount of rejection selectivity for the upper adjacent channel, which is otherwise completely lacking.

Figure 6:
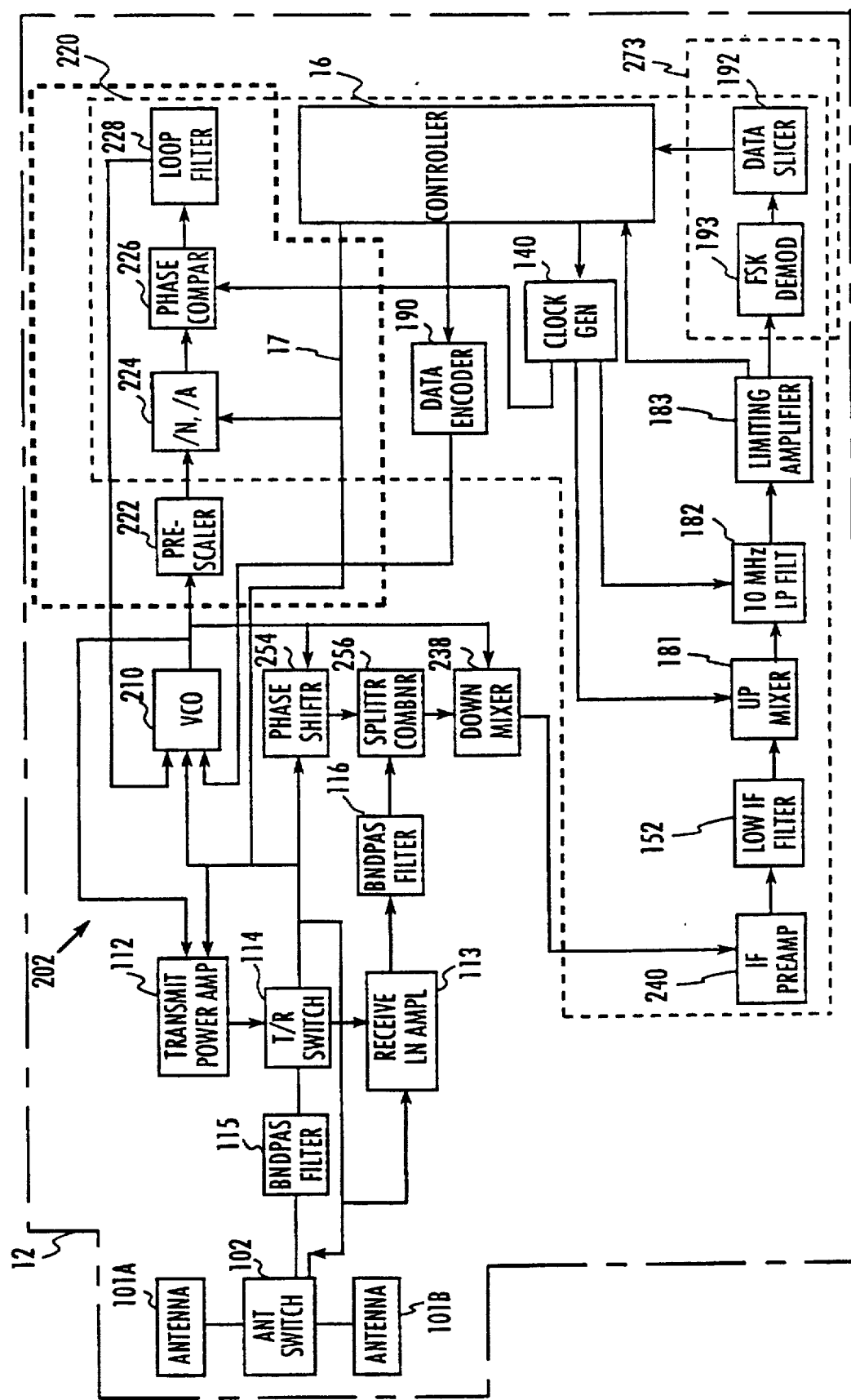
FIG. 6 is a local oscillator leakage rejection circuit for use in the communication system nodes illustrated in FIGS. 1, 2, and 3 according to seventh and eighth exemplary embodiments of the present invention.

With reference to FIG. 6, a communications system node 202 includes a transceiver 12 and a controller 16. Transceiver 12 is similar to transceiver 12 illustrated in FIGS. 3 and 4. However, transceiver 12 illustrated in FIG. 6 directly modulates the radio frequency signal with a VCO 210 and a synthesizer 220. Synthesizer 220 includes a prescaler 222, a divider 224, a phase comparator 226 and a loop filter 228. VCO 210 is configured to produce a radio frequency signal between 2.4 and 2.5 GHz in response to a channel selection signal on control bus 17 and a control signal from filter 228.

VCO 210 and synthesizer 220 further cooperate to provide a 2.45 to 2.55 GHz signal which is received by a mixer 238. Mixer 238 provides a very low IF signal in the receive mode for reception by IF preamplifier 240. The use of a phase shifter 254 and a splitter combiner 256 before mixer 238 cooperate to provide an inverted phase to cancel the leakage from mixer 238 through amplifier 113 to antennas 101A and 101B. The receive low noise amplifier 113 is normally unable to provide sufficient reverse isolation for allowable leakage to the antenna, and, owing the extreme proximity of the received signal frequency and local oscillator signal frequency coming from VCO 210, the bandpass filters 115 and 116 cannot reject the local oscillator signal. Circuit 256 is a microstrip design or bi-directional coupler. Circuit 256 provides a degree of isolation between circuit 254. Circuit 254 is preferably a variable phase shifter comprised of reactive elements implemented in a microstrip design. Transceiver 12 advantageously only requires one VCO to properly convert the RF signal to the very low IF signal. Preferably, Gallium Arsenide components are avoided in order to reduce the amount of noise at lower frequencies.

It is understood that while the detailed drawings and specific examples given describe a preferred exemplary embodiment of the present invention, they are for the purpose of illustration only. The invention is not limited to the precise details and conditions disclosed. For example, although particular types of oscillators, filters and comparators are mentioned, other types may be utilized. Also, although particular frequency ranges and modulation techniques are discussed, the invention is applicable to a variety of radio frequency applications. Further, single lines in the various figures may represent multiple conductors. Various changes may be made to the detailed disclosure without departing from the spirit of the invention which is defined by the following claims.

What is claimed is:

1. A receiver for use in a wireless network, information being communicated on the wireless network on a modulated carrier wave at one of a plurality of channel frequencies, the modulated carrier wave having important sidebands extending a certain amount on either side of the carrier (channel center) frequency, the receiver comprising:

a carrier wave input;

a frequency synthesizer;

a mixer having a first input coupled to the carrier wave input to receive a carrier wave signal from the carrier wave input, a second input coupled to the frequency synthesizer to receive a synthesizer signal, and a mixer output, wherein the synthesizer signal has a frequency approximate the one of said channel frequencies, wherein the mixer provides a very low intermediate frequency signal at the mixer output, the very low intermediate frequency signal having a center frequency just greater than the difference frequency between the highest frequency important sidebands and the carrier frequency;

a band pass filter having a filter input and a filter output, the filter input being coupled to the mixer output and a filter output; and a decoder coupled to the filter output, the decoder receiving a signal corresponding to the very low intermediate frequency signal and providing a decoded signal indicative of the information on the modulated carrier wave.

2. The receiver of claim 1 wherein the channel frequencies are spaced from each other by a predetermined interval and the frequency of the synthesizer signal differs from the one of said channel frequencies by one-half of said predetermined interval.

3. The receiver of claim 1 wherein the channel frequencies are spaced from each other by a predetermined interval and the frequency of the synthesizer signal differs from the one of said channel frequencies by one-fourth of said predetermined interval.

4. The receiver of claim 1 wherein the frequency of the very low intermediate frequency signal is above the baseband frequency and below 1 MHz.

5. The receiver of claim 4 wherein the filter is an audio band pass filter.

6. The receiver of claim 1 wherein the decoder includes a fast phase locked loop.

7. The receiver of claim 1 wherein the channel frequencies are between 2.3 and 2.6 GHz.

8. The receiver of claim 1 wherein the channel frequencies are between 800 and 1000 MHz.

9. The receiver of claim 8 wherein the carrier wave is modulated with the information by Gaussian frequency shift keying.

10. A receiver for receiving a baseband frequency signal transmitted on a modulated carrier wave having one of a plurality of channel frequencies, the modulated carrier wave having important sidebands extending a certain amount on either side of the carrier (channel center) frequency, the receiver comprising:

antenna means for receiving the modulated carrier wave;

frequency source means for providing a source frequency signal, the source frequency signal having a frequency approximate the one of the channel frequencies;

intermediate frequency means for receiving the source frequency signal and the modulated carrier wave and generating a very low intermediate frequency signal having a frequency greater than the peak deviation signal; and a demodulator means for receiving the very low intermediate frequency signal and providing a demodulated signal indicative of the baseband frequency signal transmitted on the modulated carrier wave.

11. The receiver of claim 10 wherein the channel frequencies are spaced from each other by a predetermined interval and the source frequency signal differs from the one of said channel frequencies by one-half of said predetermined interval.

12. The receiver of claim 10 wherein the channel frequencies are spaced from each other by a predetermined interval and the source frequency signal differs from the one of said channel frequencies by some advantageous fraction less than or equal to ½, which is high enough to accommodate all important sideband energy of the desired signal of said predetermined interval.

13. The receiver of claim 10 wherein the center frequency of the very low intermediate frequency signal is higher than the absolute value of the difference between the carrier frequency of the incoming signal and important sideband component of the important sideband having a frequency furthest removed from the important sideband, and below 1 MHz.

14. The receiver of claim 1 wherein the channel frequencies are between 2.3 and 2.6 GHz.

15. A method of receiving information on a modulated carrier wave having peak important sidebands extending a certain amount on either side of the carrier (channel center) frequency, the receiver comprising steps of:

receiving the modulated carrier wave signal;

amplifying the modulated carrier wave signal to generate an amplified modulated carrier signal;

generating a mixing signal having a frequency approximate the one of the channel frequencies;

mixing the mixing signal and the amplified modulated carrier signal to form a very low intermediate frequency signal having a frequency above a peak modulation deviation; and demodulating a result signal related to the very low intermediate frequency signal to obtain the information on the modulated carrier wave.

16. The method of claim 15 wherein the mixing signal has a frequency within a channel frequency interval of the modulated carrier wave frequency.

17. The method of claim 15 wherein the result signal is a filtered low intermediate frequency signal.

18. The method of claim 16 wherein the very low intermediate frequency signal is between the baseband frequency and 1 MHz.

19. The method of claim 18 wherein the mixing signal differs from the modulated carrier signal by approximately 500 KHz.

* * * * *